United States Patent
Wago et al.

(10) Patent No.: US 6,869,557 B1
(45) Date of Patent: Mar. 22, 2005

(54) MULTI-LEVEL STAMPER FOR IMPROVED THERMAL IMPRINT LITHOGRAPHY

(75) Inventors: Koichi Wago, Sunnyvale, CA (US); Gennady Gauzner, Livermore, CA (US); Christopher Joseph Formato, Brentwood, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 326 days.

(21) Appl. No.: 10/156,063

(22) Filed: May 29, 2002

Related U.S. Application Data

(60) Provisional application No. 60/368,674, filed on Mar. 29, 2002.

(51) Int. Cl.⁷ ............... G28B 11/08; B29C 59/00; B29D 17/00
(52) U.S. Cl. ............... 264/293; 264/106; 264/107; 425/385; 425/394
(58) Field of Search ............... 264/293, 106, 264/107; 425/385, 394

(56) References Cited

U.S. PATENT DOCUMENTS 6,753,130 B1 * 6/2004 Liu et al. ............... 430/313
6,757,116 B1 * 6/2004 Curtiss et al. ............... 360/15

* cited by examiner

Primary Examiner—Stephen J. Lechert, Jr.
(74) Attorney, Agent, or Firm—McDermott Will & Emery LLP

(57) ABSTRACT

A stamper/imprinter for use in performing thermal imprint lithography of a substrate/workpiece surface to form a pattern of features in first portions of the surface intended to receive the pattern, without incurring random formation of undesired, disordered features in second portions of the substrate/workpiece surface not intended to receive the pattern, comprising an imprinting surface configured to substantially prevent formation of gaps between the imprinting surface and the second portions of the surface during stamping/imprinting. Embodiments include stampers/imprinters with a multilevel imprinting surface comprises a first portion having a first level for forming the pattern of features in the first portions of the surface and a second portion having a second level for substantially preventing formation of gaps between the imprinting surface and the second portions of the surface during stamping/imprinting.

19 Claims, 3 Drawing Sheets

MULTI-LEVEL STAMPER FOR IMPROVED THERMAL IMPRINT LITHOGRAPHY

CROSS-REFERENCE TO PROVISIONAL APPLICATION

This application claims priority from U.S. provisional patent application Ser. No. 60/368,674 filed Mar. 29, 2002, the entire disclosure of which is incorporated herein by reference.

FIELD OF THE INVENTION

The present invention relates to methods and apparatus for forming sub-micron sized features and patterns in large area substrate surfaces by means of thermal imprint lithography. The invention has particular utility in the formation of servo patterns in the surfaces of substrates utilized in the manufacture of data/information storage and retrieval media, e.g., hard disk magnetic media.

BACKGROUND OF THE INVENTION

Optical-based lithographic techniques are widely employed in the fabrication of integrated circuits (ICs) and other devices requiring very fine-dimensioned patterns or features. However, the constantly increasing demands of micro-miniaturization for increased data storage and computation require fabrication of devices with ever smaller dimensions, which demands tax or even exceed the limits of conventional optical lithographic patterning processes utilizing visible light. As a consequence, intense research has been conducted on ultra-violet (UV), X-ray, electron beam (e-beam), and scanning probe (SP) lithography. However, while each of these techniques is capable of providing high resolution, finely-dimensioned patterns and features, the economics of their use is less favorable, due to such factors as limitations arising from wavelength-dependent phenomena, slow e-beam and SP writing speeds, and difficulties in the development of suitable resist materials.

Thermal imprint lithography has been recently studied and developed as a low cost alternative technique for fine dimension pattern/feature formation in the surface of a substrate or workpiece, as for example, described in U.S. Pat. Nos. 4,731,155; 5,772,905; 5,817,242; 6,117,344; 6,165,911; 6,168,845 B1; 6,190,929 B1; and 6,228,294 B1, the disclosures of which are incorporated herein by reference. A typical thermal imprint lithographic process for forming nano-dimensioned patterns/features in a substrate surface is illustrated with reference to the schematic, cross-sectional views of FIGS. 1(A)–1(D).

Referring to FIG. 1(A), shown therein is a mold 10 (also referred to herein as a "stamper/imprinter") including a main body 12 having upper and lower opposed surfaces, with a molding (i.e., stamping/imprinting) layer 14 formed on the lower opposed surface. As illustrated, molding layer 14 includes a plurality of features 16 having a desired shape or surface contour. A workpiece comprised of a substrate 18 carrying a thin film layer 20 on an upper surface thereof is positioned below, and in facing relation to the molding layer 14. Thin film layer 20 is typically comprised of a thermoplastic material, e.g., poly(methylmethacrylate), herein abbreviated as "PMMA", and may be formed on the substrate/workpiece surface by any appropriate technique, e.g., spin coating.

Adverting to FIG. 1(B), shown therein is a compressive molding step, wherein mold 10 is pressed into the thin film layer 20 in the direction shown by arrow 22, so as to form depressed, i.e., compressed, regions 24. In the illustrated embodiment, features 16 of the molding layer 14 are not pressed into the thin film layer 20 for the entire depth thereof, and thus do not contact the surface of the underlying substrate 18. However, the top surface portions 24a of thin film 20 may contact depressed surface portions 16a of molding layer 14. As a consequence, the top surface portions 24a substantially conform to the shape of the depressed surface portions 16a, for example, flat. When contact between the depressed surface portions 16a of molding layer 14 and thin film layer 20 occurs, further movement of the molding layer 14 into the thin film layer 20 stops, due to the sudden increase in contact area, leading to a decrease in compressive pressure when the compressive force is constant.

FIG. 1(C) shows the cross-sectional surface contour of the thin film layer 20 following removal of mold 10. The molded, or imprinted, thin film layer 20 includes a plurality of recesses formed at compressed regions 24 which generally conform to the shape or surface contour of features 16 of the molding layer 14. Referring to FIG. 1(D), in a next step, the surface-molded workpiece is subjected to processing to remove the compressed portions 24 of thin film 20 thereby to selectively expose portions 28 of the underlying substrate 18 separated by raised features 26. Selective removal of the compressed portions 24, as well as subsequent selective removal of part of the thickness of substrate 18 at the exposed portions 28 thereof, may be accomplished by any appropriate process, e.g., reactive ion etching (RIE) or wet chemical etching.

The above-described imprint lithographic processing is capable of providing sub-micron-dimensioned features, as by utilizing a mold 10 provided with patterned features 16 comprising pillars, holes, trenches, etc., by means of e-beam lithography, RIE, or other appropriate patterning method. Typical depths of features 16 range from about 5 to about 500 nm, depending upon the desired lateral dimension. The material of the molding layer 14 is typically selected to be hard relative to the thin film layer 20, the latter typically comprising a thermoplastic material which is softened when heated. Thus, suitable materials for use as the molding layer 14 include metals, dielectrics, semiconductors, ceramics, and composite materials. Suitable materials for use as thin film layer 20 include thermoplastic polymers which can be heated to above their glass temperature, $T_g$, such that the material exhibits low viscosity and enhanced flow.

Referring now to FIG. 2, schematically illustrated therein, in simplified cross-sectional view, is a typical sequence of processing steps for performing nano-imprint lithography of a metal-based substrate/workpiece, i.e., an Al/NiP substrate/workpiece, utilizing a conventional "master" or stamper/imprinter, e.g., a Ni-based stamper/imprinter. In a preliminary step, a thin film of a thermoplastic polymer, e.g., a poly(methylmethacrylate), i.e., PMMA, is spin-coated on an annular disk-shaped Al/NiP substrate/workpiece, corresponding to substrates conventionally employed in the manufacture of hard disk magnetic recording media. In another preliminary step, a Ni stamper/imprinter having an imprinting surface with a negative image pattern of features, e.g., a servo pattern with lateral dimensions of about 600 nm and heights of about 170 nm, is fabricated by conventional optical lithographic patterning/etching techniques, provided with a thin layer of an anti-sticking or release agent (typically a fluorinated polyether compound such as Zdol™, available from Ausimont, Thorofare, N.J.), and installed in a suitably configured stamping/imprinting tool. In the next step according to the conventional methodology for performing thermal imprint lithography, the substrate/ workpiece is placed in the stamping/imprinting tool and heated along with the stamper/imprinter to a temperature above the glass transition temperature ($T_g$) of the PMMA, i.e., above about 105° C., e.g., up to about 140° C., after which the patterned imprinting surface of the Ni-based stamper/imprinter is pressed into contact with the surface of the heated thermoplastic PMMA layer on the substrate/ workpiece at a suitable pressure, e.g., about 10 MPa. As a consequence, the negative image of the desired pattern on the imprinting surface of the Ni-based stamper/imprinter is embossed into the surface of the thermoplastic PMMA layer. The stamper/imprinter is then maintained within the stamping/imprinting tool in contact with the PMMA layer and under pressure for an interval until the system cools down to an appropriate temperature, e.g., about 70° C., after which interval the substrate/workpiece is removed from the stamping/imprinting tool and the stamper/imprinter separated from the substrate/workpiece to leave replicated features of the imprinting surface in the surface of the PMMA layer.

However, two significant problems have been encountered with the use of the above-described thermal imprint lithography technique when utilized with conventionally configured stampers/imprinters for replicating patterns comprised of areas with periodically arranged small features surrounded by areas with no features, e.g., as in the formation of servo sectors of servo-patterned data/information storage and retrieval media, such as hard disk magnetic media.

Referring to FIG. 3, a first problem which is encountered is the random formation of disordered, maze-like features 20' in non-pattern portions $20_{NP}$ of the thermoplastic PMMA layer 20 adjacent the regularly-patterned servo sectors $20_{SERVO}$, i.e., non-pattern portions $20_{NP}$ correspond to surface areas of the substrate/workpiece 18 which are intended to be feature-free. It has been determined that formation of such undesired, disordered features 20' in areas $20_{NP}$ not intended to be patterned arises from the presence of gaps G between the imprinting surface of the molding layer 14 of the stamper/imprinter 10 and the thermoplastic layer 20 in the non-pattern areas $20_{NP}$, presumably due to the presence of long-range attractive forces between the stamper/ imprinter 10 and the thermoplastic layer 20.

A second problem is destruction of at least parts of the replicated patterns, e.g., servo patterns, primarily arising from the difference in thermal expansion characteristics of the stamper/imprinter 10 and the substrate/workpiece with the thermoplastic layer thereon (20/18). Previous approaches for circumventing or alleviating this problem have involved the use of stampers/imprinters thermally matched to the workpiece. However, such approach disadvantageously entails costly preparation of suitable stampers/ imprinters 10 comprised of materials which are thermally-matched with the substrate/workpiece material(s) 20/18.

In view of the above, there exists a need for improved means and methodology for performing thermal imprint lithography which eliminates, or at least substantially reduces, the above-described problems of undesired, disordered feature formation in unpatterned areas and pattern destruction arising from incompatible thermal expansion characteristics of the stamper/imprinter and workpiece associated with conventional thermal imprint lithography. More specifically, there exists a need for improved means and methodology for accurately and safely imprinting or embossing a pattern, e.g., a servo pattern, in a surface of a resist or other type relatively soft layer on the surface of a substrate for a data/information storage and retrieval medium, e.g., a hard disk magnetic recording medium.

The present invention addresses and solves the above-described problems and difficulties associated with conventional techniques and methodologies for performing thermal imprint lithography for pattern definition in substrate/ workpiece surfaces, such as in the fabrication of hard disk substrates with integrally formed servo patterns, while maintaining full compatibility with all aspects of conventional automated manufacturing technology for pattern formation by imprint lithography. Further, the means and methodology afforded by the present invention enjoy diverse utility in imprint lithographic patterning of a variety of substrates/ workpieces.

DISCLOSURE OF THE INVENTION

An advantage of the present invention is an improved method of performing thermal imprint lithography of a substrate/workpiece surface, wherein random formation of undesired, disordered features in portions of the surface where features are not intended to be formed, is substantially prevented.

Another advantage of the present invention is an improved method of performing thermal imprint lithography of a substrate/workpiece surface, wherein pattern destruction resulting from shear forces arising from relative movement between the stamper/imprinter utilized for pattern imprinting and the substrate/workpiece during thermal cycling between lower and higher temperatures is substantially prevented.

Yet another advantage of the present invention is an improved, multilevel stamper/imprinter for use in performing thermal imprint lithography of a substrate/workpiece surface, wherein random formation of undesired, disordered features in portions of the surface where features are not intended to be formed, is substantially prevented.

Still another advantage of the present invention is an improved multilevel, shallow-grooved stamper/imprinter for use in performing thermal imprint lithography of a substrate/ workpiece surface wherein pattern destruction resulting from shear forces arising from relative movement between the stamper/imprinter and the substrate/workpiece during thermal cycling between lower and higher temperatures, is substantially prevented.

Additional advantages and other aspects and features of the present invention will be set forth in the description which follows and in part will become apparent to those having ordinary skill in the art, upon examination of the following, or may be learned from the practice of the present invention, the advantages of the present invention may be realized and obtained as particularly pointed out in the appended claims.

According to an aspect of the present invention, the foregoing and other advantages are obtained in part by a method of performing thermal imprint lithography of a substrate/workpiece surface to form a pattern of features in first portions of the surface intended to receive the pattern, without incurring random formation of undesired, disordered features in second portions of the substrate/workpiece surface not intended to receive the pattern, which method comprises utilizing a stamper/imprinter having an imprinting surface configured to substantially prevent formation of gaps between the imprinting surface of the stamper/ imprinter and the second portions of the substrate/workpiece surface during stamping/imprinting.

According to embodiments of the present invention, the stamper/imprinter comprises:

a main body; and a multilevel imprinting surface including a negative image of the pattern of features to be formed in the first portions of the substrate/workpiece surface.

In accordance with certain embodiments of the present invention, the multilevel imprinting surface comprises a first portion having a first level for forming the pattern of features in the first portions of the substrate/workpiece surface and a second portion having a second level for substantially preventing formation of gaps between the imprinting surface of the stamper/imprinter and the second portions of the substrate/workpiece surface during stamping/imprinting. According to particular embodiments of the present invention, the first level is below the second level.

Further embodiments of the method for performing thermal imprint lithography according to the present invention comprise utilizing a stamper/imprinter wherein the second portion of the multilevel imprinting surface further comprises grooves formed to a shallow depth therein, for substantially preventing occurrence of shear forces between the stamper/imprinter and the substrate/workpiece surface arising from relative movement therebetween during thermal cycling between lower and higher temperatures during the thermal imprint lithography process.

According to certain embodiments of the present invention, the substrate/workpiece surface comprises a layer of a thermoplastic polymer resist material thereon and the shallow depth grooves formed in the second portion of the multilevel imprinting surface are replicated in the layer of thermoplastic polymer resist material, but the layer of thermoplastic polymer resist material is sufficiently thick as to prevent removal of portions of the substrate/workpiece surface beneath the shallow depth grooves during subsequent processing for pattern formation; and the subsequent processing for pattern formation comprises a material removal process, selected from a group consisting of sputter etching, reactive ion etching, ion-beam etching, and wet chemical etching.

In accordance with embodiments of the present invention of particular utility in the manufacture of recording media, the substrate/workpiece is a disk-shaped substrate for a hard disk data/information storage and retrieval medium; and the pattern of features in the first portions of the surface of the disk-shaped substrate comprises a servo pattern; wherein the disk-shaped substrate comprises a material selected from the group consisting of Al, Al/NiP, Al-based alloys, other metals, other metal alloys, polymers, polymer-based materials, glass, ceramics, and composites and laminates thereof; the thermoplastic polymer resist material comprises a poly(methylmethacrylate); and the imprinting surface of the stamper/imprinter comprises a material selected from the group consisting of Ni, Ni-based alloys, other metals, other metal alloys, dielectrics, semiconductors, ceramics, and composites and laminates thereof.

Another aspect of the present invention is a stamper/imprinter for use in performing thermal imprint lithography of a substrate/workpiece surface to form a pattern of features in first portions of the surface intended to receive the pattern, without incurring random formation of undesired, disordered features in second portions of the substrate/workpiece surface not intended to receive the pattern, comprising an imprinting surface which is configured to substantially prevent formation of gaps between the imprinting surface of the stamper/imprinter and the second portions of the substrate/workpiece surface during stamping/imprinting.

According to embodiments of the present invention, the stamper/imprinter comprises a main body; and a multilevel imprinting surface including a negative image of the pattern of features to be formed in the first portions of the substrate/workpiece surface, e.g., the multilevel imprinting surface comprises a first portion having a first level for forming the pattern of features in the first portions of the substrate/workpiece surface and a second portion having a second level for substantially preventing formation of gaps between the imprinting surface of the stamper/imprinter and the second portions of the substrate/workpiece surface during stamping/imprinting.

In accordance with certain embodiments of the present invention, the first level is below the second level.

According to further embodiments of the present invention, the second portion of the multilevel imprinting surface further comprises grooves formed to a shallow depth therein, for substantially preventing occurrence of shear forces between the stamper/imprinter and the substrate/workpiece surface arising from relative movement therebetween during thermal cycling between lower and higher temperatures during the thermal imprint lithography.

In accordance with particular embodiments of the present invention especially useful in the manufacture of servo-patterned recording media, the pattern of features in the first portions of said imprinting surface comprises a negative image of a servo pattern for a disk-shaped data/information storage and retrieval medium; and the imprinting surface of the stamper/imprinter comprises a material selected from the group consisting of Ni, Ni-based alloys, other metals, other metal alloys, dielectrics, semiconductors, ceramics, and composites and laminates thereof.

Still another aspect of the present invention is a stamper/imprinter for performing thermal imprint lithography, comprising:

a main body; and means for forming a pattern of features in first portions of a substrate/workpiece surface intended to receive the pattern, without incurring random formation of undesired, disordered features in second portions of the substrate/workpiece surface not intended to receive the pattern.

According to embodiments of the present invention, the means comprises means for forming a servo pattern of a disk-shaped data/information storage and retrieval medium; and the means further comprises means for substantially preventing occurrence of shear forces between the stamper/imprinter and the substrate/workpiece surface arising from relative movement therebetween during thermal cycling between lower and higher temperatures during the thermal imprint lithography.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the features are not drawn to scale but rather are drawn as to best illustrate the pertinent features and the same reference numerals are utilized throughout for designating similar features, wherein.

DESCRIPTION OF THE INVENTION

Figure 1A:
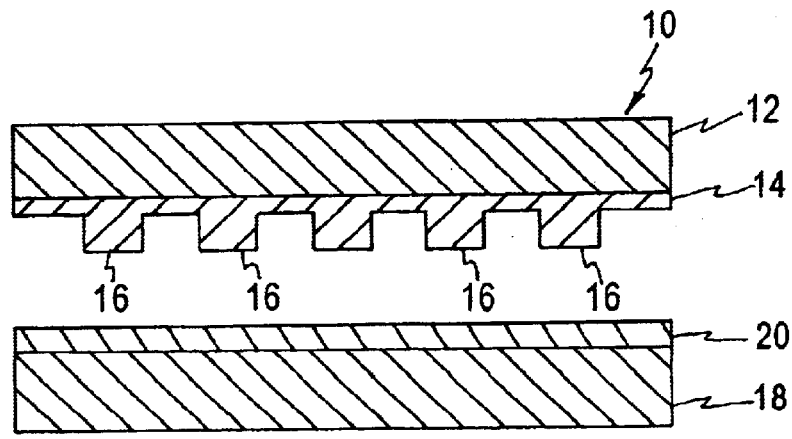
FIGS. 1(A)–1(D) are schematic, simplified, cross-sectional views illustrating a process sequence for performing thermal imprint lithography of a thin resist film on a substrate/workpiece according to the conventional art.
Figure 1B:
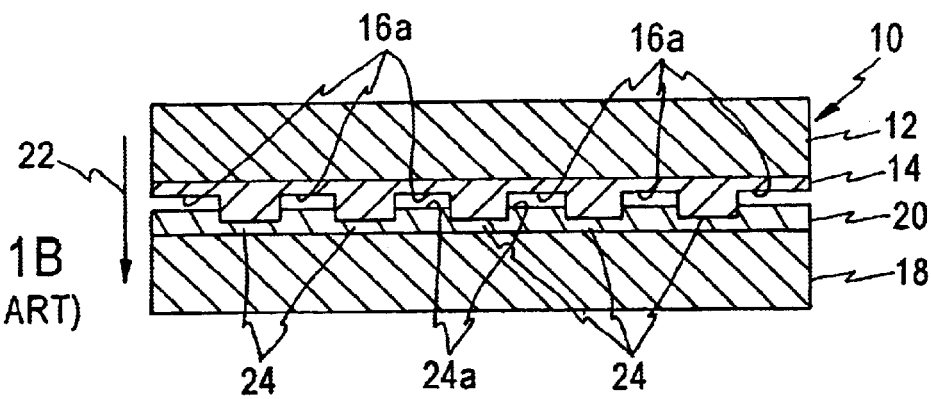
Figure 1C:
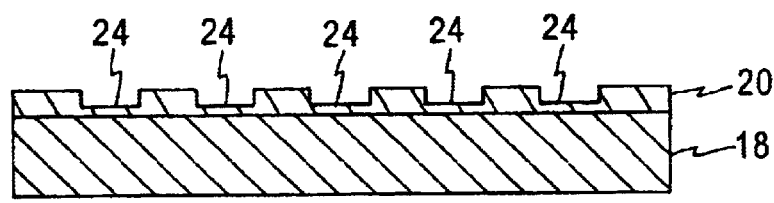
Figure 1D:
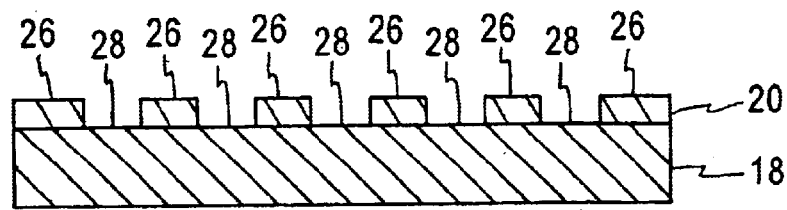

The present invention addresses and solves problems of random, undesired feature formation and pattern destruction attendant upon the use of thermal imprint lithography, e.g., nano-imprint lithography, for forming sub-micron-dimensioned patterns in a substrate/workpiece surface, as in servo patterning of disk-shaped substrates utilized in the manufacture of hard disk recording media. Specifically, the present invention provides a substantial improvement in product quality, yield, and cost-effectiveness when performed as part of a continuous, automated manufacturing process, e.g., hard disk manufacture, and is based upon the discovery that occurrences of random formation of undesired, disordered features in portions of the surface of the substrate/workpiece not intended to receive the pattern, can be substantially prevented, or at least minimized, by utilizing a stamper/imprinter having an imprinting surface configured to substantially eliminate formation of gaps between the imprinting surface and the portions of the surface of the substrate/workpiece not intended to receive the pattern. In addition, the present invention is based upon the discovery that pattern destruction resulting from shear forces between the stamper/imprinter and the substrate/workpiece surface arising from relative movement therebetween during thermal cycling between lower and higher temperatures in the course of performing the thermal imprinting process, can be substantially prevented in a manner not requiring matching of the thermal expansion characteristics of the stamper/imprinter with those of the substrate/workpiece. The inventive means and methodology advantageously maintain full compatibility with all other aspects of conventional automated manufacturing technology for pattern formation, e.g., servo patterning for hard disk media, by thermal imprint lithography.

According to a key feature of the present invention, a stamper/imprinter is provided which includes a main body and a multilevel imprinting surface including a negative image of the pattern of features to be formed in the first portions of the substrate/workpiece surface, e.g., a servo pattern, wherein the multilevel imprinting surface comprises a first portion having a first level for forming the pattern of features in first portions of the substrate/workpiece surface and a second portion having a second level for substantially preventing formation of gaps between the imprinting surface of the stamper/imprinter and second, unpatterned portions of the substrate/workpiece surface during stamping/imprinting, the first level being below, i.e., lower than, the second level.

Another key feature of the present invention is provision and use of a multilevel stamper/imprinter wherein the second portion of the imprinting surface includes grooves formed therein to a shallow depth, for substantially preventing occurrence of shear forces between the stamper/imprinter and the substrate/workpiece surface arising from relative movement therebetween during thermal cycling between lower and higher temperatures during the thermal imprint lithography process, whereby pattern destruction is eliminated.

Figure 3:
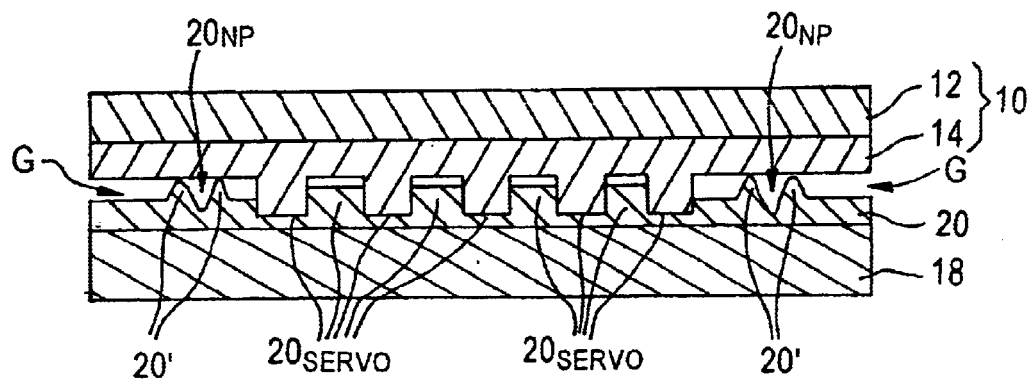
FIG. 3 schematically illustrates, in simplified, cross-sectional view, disordered feature formation on a thermoplastic polymer resist when thermal imprint lithography is utilized with a conventionally configured stamper/imprinter to form a small feature pattern, e.g., a servo pattern, surrounded by areas with no patterns.
Figure 4:
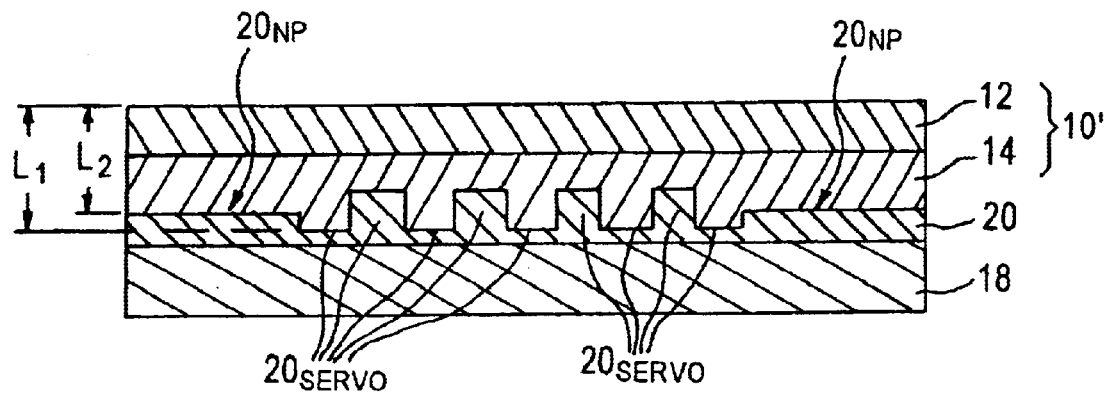
FIG. 4 schematically illustrates, in simplified, cross-sectional view, pattern replication by means of thermal imprint lithography of a thermoplastic resist layer on a substrate/workpiece surface utilizing a multilevel stamper/imprinter according to an embodiment of the present invention.

An embodiment of a multilevel stamper/imprinter 10' according to the invention, wherein the imprinting surface of the molding or stamping layer 14 is configured to substantially prevent the formation of gaps G between the imprinting surface and the thermoplastic layer 20 of the substrate/workpiece 18/20 in the non-patterned areas $20_{NP}$ is illustrated in schematic, simplified, cross-sectional view in FIG. 4. According to this embodiment, the stamper/imprinter 10' comprises a molding or stamping layer 14, e.g., of a material selected from among Ni, Ni-based alloys, other metals, other metal alloys, dielectrics, semiconductors, ceramics, and composites and laminates thereof, with a multilevel imprinting surface including (1) a first portion extending downwardly to a first level $L_1$ and comprising a negative image of a desired pattern of features to be formed in the surface of the substrate/workpiece 18/20, illustratively a servo pattern $20_{servo}$, in first portions of the surface of the thermoplastic layer 20, e.g., a PMMA layer, on the upper surface of substrate 18, illustratively a disk-shaped substrate for a data/information storage and retrieval medium, such as a magnetic hard disk, comprised of a material selected from among Al, Al/NiP, Al-based alloys, other metals, other metal alloys, polymers, polymer-based materials, glass, ceramics, and composites and laminates thereof; and (2) a second portion extending downwardly to a second, higher level $L_1$, such that $L_1 > L_1$, which second portion directly contacts the surface of thermoplastic layer 20 during stamping/imprinting, thus substantially preventing formation of gaps G (see FIG. 3) between the imprinting surface of molding or stamping layer 14 and the second, non-patterned portions $20_{NP}$ of the surface of the thermoplastic layer 20.

According to the invention, elimination of gaps G between the imprinting surface of molding or stamping layer 14 and second, non-patterned portions $20_{NP}$ of the surface of the thermoplastic layer 20 by use of the multilevel stamper/imprinter 10' of FIG. 4 results in substantially complete prevention of random formation of undesired, disordered or irregularly-shaped features (20') in the non-patterned portions $20_{NP}$, which result is confirmed by scanning probe Atomic Force Measurements (AFM) of thermally imprinted PMMA surfaces formed by use of the inventive multilevel stamper/imprinter 10'. Subsequent processing of the imprinted substrate/workpiece 18/20 proceeds according to the processing sequence described supra in connection with FIGS. 1(A)–1(D) to yield accurately replicated servo patterns.

Figure 2:
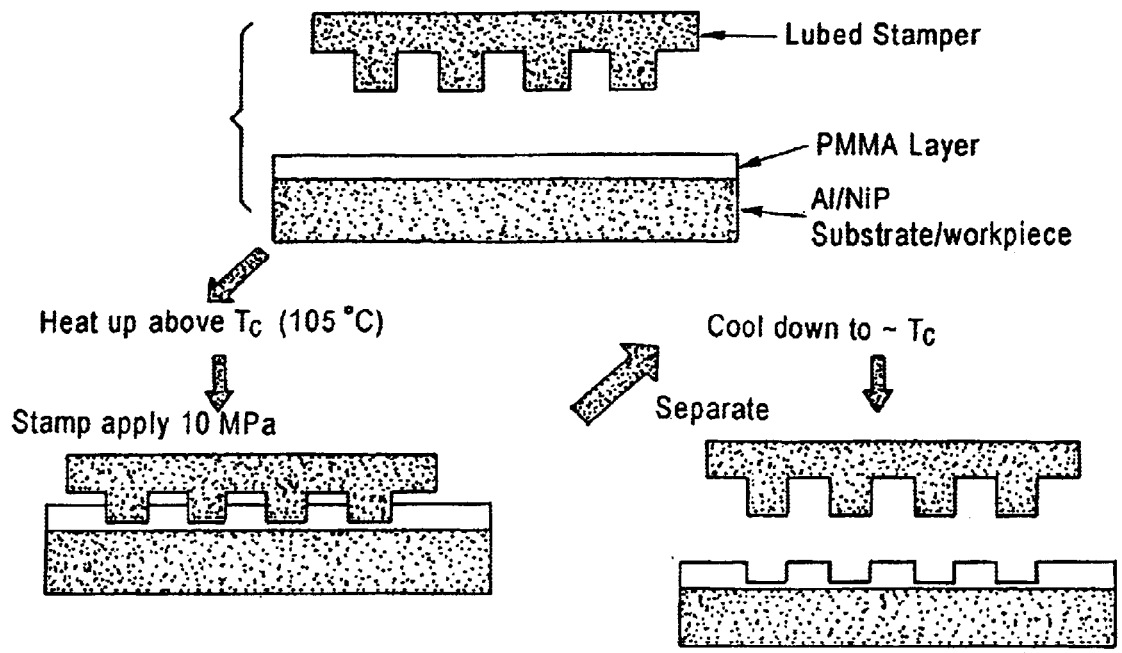
FIG. 2 schematically illustrates, in simplified, cross-sectional view, another sequence of steps for performing thermal imprint lithography of a thermoplastic polymer resist film according to the conventional art.
Figure 5:
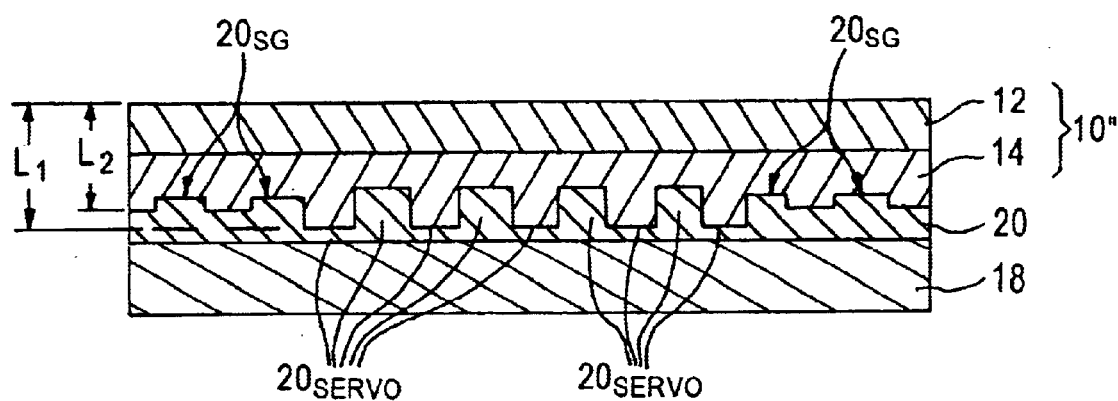
FIG. 5 schematically illustrates, in simplified, cross-sectional view, pattern replication by means of thermal imprint lithography of a thermoplastic resist layer on a substrate/workpiece surface utilizing a shallow-grooved, multilevel stamper/imprinter according to another embodiment of the present invention.

Another embodiment of a multilevel stamper/imprinter 10" according to the invention is illustrated in schematic, simplified, cross-sectional view in FIG. 5. As shown therein, the stamper/imprinter 10" comprises a molding or stamping layer 14 with a multilevel imprinting surface including (1) a first portion extending downwardly to a first level $L_1$ for forming a desired pattern of features, illustratively a servo pattern $20_{servo}$, in first portions of the surface of a thermoplastic layer 20 on the upper surface of the substrate/workpiece, illustratively a disk-shaped substrate 18 for a data/information storage and retrieval medium, such as a magnetic hard disk; and (2) a second portion comprised of a plurality of spaced-apart projections each extending downwardly to a second, higher level $L_2$, such that $L_1 > L_2$, which spaced-apart projections form a plurality of shallow depth grooves $20_{SG}$ in the imprinting surface of molding or stamping layer 14 for substantially preventing occurrence of shear forces between the stamper/imprinter 10" and the surface of the substrate/workpiece 18/20 arising from relative movement therebetween during thermal cycling between lower and higher temperatures during the thermal imprint lithography process (as, for example, described supra in connection with FIG. 2). According to a preferred embodiment of the present invention, the shallow depth grooves $20_{SG}$ formed in the second portion of the multilevel imprinting surface of stamper/imprinter 10" are replicated in layer 20 of thermoplastic polymer resist material, but resist layer 20 is sufficiently thick as to prevent removal of portions of the surface of substrate 18 beneath the shallow depth grooves $20_{SG}$ during subsequent processing for pattern formation, e.g., by a material removal process selected from among sputter etching, reactive ion etching, ion-beam etching, and wet chemical etching. The stamper/imprinter 10" of FIG. 5 advantageously enables use of stamper/imprinter materials thermally mismatched with those of the substrate/workpiece 18/20, and scanning probe AFM studies of replicated surfaces obtained by use of shallow-groove-containing stampers/imprinters 10" have confirmed their ability to repeatedly provide excellent replication quality with no or minimal product loss due to pattern destruction from thermal cycling.

EXAMPLE

Shallow-grooved, multilevel stampers/imprinters 10" as shown in FIG. 5 were fabricated by means of a laser beam exposure apparatus and Ni electroplating. The shallow grooves $20_{SG}$ were patterned on a photoresist layer using a lower exposure dose than that used for patterning the full height (or depth) features $20_{SERVO}$ of the servo pattern portion of the imprinting surface. Ni was electroplated on the patterned photoresist to replicate the resist pattern. Several generations of stampers/imprinters 10" were fabricated by successive electroplating of the patterned photoresist. Servo patterns were stamped/imprinted onto PMMA-coated, Al disk substrates at about 140° C. and released therefrom at about 120° C. Excellent replication fidelity was obtained, as determined by scanning probe AFM measurements. Further, the excellent replication fidelity was obtained despite the use of the Ni-based stampers/imprinters 10", which have a different thermal expansion characteristic than that of the Al disk substrates. While the shallow grooves were replicated in the imprinted PMMA layer, the shallow height of the feature grooves resulted in the residual, compressed PMMA layer at the bottoms of the grooves formed in the PMMA layer being sufficiently thick as to protect the underlying areas of the Al substrate from the succeeding material removal processing for patterning the Al substrate (e.g., reactive ion etching, ion beam etching, or wet chemical etching).

Thus, the inventive methodology utilizing multilevel stampers/imprinters provides for the performance of imprint lithography with improved replication fidelity and product yield, as compared with thermal imprint lithographic processing utilizing conventional stampers/imprinters. Further, the inventive methodology readily permits the use of stampers/imprinters and substrates/workpieces of different materials with different thermal expansion charateristics. For example, according to the invention, stampers/imprinters with Ni imprinting surfaces can be readily employed for imprinting of glass and metal-based substrates/workpieces, e.g., Al-based substrates, such as are conventionally utilized in the fabrication of hard disk magnetic recording media.

Moreover, the inventive methodology is not limited to use as described above in the illustrated examples; rather, the invention can be practiced with a wide variety of substrates/workpieces, such as, for example, semiconductor substrates utilized in integrated circuit (IC) device manufacture, and the imprinted patterns capable of being formed by the invention are not limited to servo patterns for magnetic recording media, and may, for example, include metallization patterns of semiconductor IC devices.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiments of the present invention and but a few examples of its versatility are shown and described in the present disclosure. It is to be understood that the present invention is capable of use in other combinations and environments and is susceptible of changes and/or modifications within the scope of the inventive concept as expressed herein.

What is claimed is:

1. A method of performing thermal imprint lithography of a substrate/workpiece surface to form a pattern of features in first portions of said surface intended to receive said pattern, without incurring random formation of undesired, disordered features in second portions of said substrate/workpiece surface not intended to receive said pattern, which method comprises utilizing a stamper/imprinter having an imprinting surface which is configured to substantially prevent formation of gaps between said imprinting surface of said stamper/imprinter and said second portions of said substrate/workpiece surface during stamping/imprinting, wherein said stamper/imprinter comprises:

a main body; and a multilevel imprinting surface including a negative image of said pattern of features to be formed in said first portions of said substrate/workpiece surface.

2. The method according to claim 1, wherein:

said multilevel imprinting surface comprises a first portion having a first level for forming said pattern of features in said first portions of said substrate/workpiece surface and a second portion having a second level for substantially preventing formation of gaps between said imprinting surface of said stamper/imprinter and said second portions of said substrate/workpiece surface during stamping/imprinting.

3. The method according to claim 2, wherein:

said first level is below said second level.

4. The method according to claim 3, wherein:

said second portion of said multilevel imprinting surface further comprises grooves formed to a shallow depth therein, for substantially preventing occurrence of shear forces between said stamper/imprinter and said substrate/workpiece surface arising from relative movement therebetween during thermal cycling between lower and higher temperatures during said thermal imprint lithography.

5. The method according to claim 4, wherein:

said substrate/workpiece surface comprises a layer of a thermoplastic polymer resist material thereon, said shallow depth grooves formed in said second portion of said multilevel imprinting surface being replicated in said layer of thermoplastic polymer resist material, wherein said layer of thermoplastic polymer resist material is sufficiently thick as to prevent removal of portions of said substrate/workpiece surface beneath said shallow depth grooves during subsequent processing for pattern formation.

6. The method according to claim 5, wherein:

said subsequent processing for pattern formation comprises a material removal process.

7. The method according to claim 6, wherein:

said material removal process is selected from a group consisting of sputter etching, reactive ion etching, ion-beam etching, and wet chemical etching.

8. The method according to claim 5, wherein:

said substrate/workpiece is a disk-shaped substrate for a hard disk data/information storage and retrieval medium; and said pattern of features in said first portions of said surface of said disk-shaped substrate comprises a servo pattern.

9. The method according to claim 8, wherein:

said disk-shaped substrate comprises a material selected from the group consisting of Al, Al/NiP, Al-based alloys, other metals, other metal alloys, polymers, polymer-based materials, glass, ceramics, and composites and laminates thereof;

said thermoplastic polymer resist material comprises a poly(methylmethacrylate); and said imprinting surface of said stamper/imprinter comprises a material selected from the group consisting of Ni, Ni-based alloys, other metals, other metal alloys, dielectrics, semiconductors, ceramics, and composites and laminates thereof.

10. A stamper/imprinter for use in performing thermal imprint lithography of a substrate/workpiece surface to form a pattern of features in first portions of said surface intended to receive said pattern, without incurring random formation of undesired, disordered features in second portions of said substrate/workpiece surface not intended to receive said pattern, comprising:

an imprinting surface which is configured to substantially prevent formation of gaps between said imprinting surface of said stamper/imprinter and said second portions of said substrate/workpiece surface during stamping/imprinting.

11. The stamper as in claim 10, comprising:

a main body; and a multilevel imprinting surface including a negative image of said pattern of features to be formed in said first portions of said substrate/workpiece surface.

12. The stamper as in claim 11, wherein:

said multilevel imprinting surface comprises a first portion having a first level for forming said pattern of features in said first portions of said substrate/workpiece surface and a second portion having a second level for substantially preventing formation of gaps between said imprinting surface of said stamper/imprinter and said second portions of said substrate/workpiece surface during stamping/imprinting.

13. The stamper/imprinter as in claim 12, wherein:

said first level is below said second level.

14. The stamper/imprinter as in claim 13, wherein:

said second portion of said multilevel imprinting surface further comprises grooves formed to a shallow depth therein, for substantially preventing occurrence of shear forces between said stamper/imprinter and said substrate/workpiece surface arising from relative movement therebetween during thermal cycling between lower and higher temperatures during said thermal imprint lithography.

15. The stamper/imprinter as in claim 11, wherein:

said pattern of features in said first portions of said imprinting surface comprises a servo pattern for a disk-shaped data/information storage and retrieval medium.

16. The stamper/imprinter as in claim 11, wherein:

said imprinting surface of said stamper/imprinter comprises a material selected from the group consisting of Ni, Ni-based alloys, other metals, other metal alloys, dielectrics, semiconductors, ceramics, and composites and laminates thereof.

17. A stamper/imprinter for performing thermal imprint lithography, comprising:

a main body; and means for forming a pattern of features in first portions of a substrate/workpiece surface intended to receive said pattern, without incurring random formation of undesired, disordered features in second portions of said substrate/workpiece surface not intended to receive said pattern.

18. The stamper/imprinter as in claim 17, wherein:

said means comprises means for forming a servo pattern of a disk-shaped data/information storage and retrieval medium.

19. The stamper/imprinter as in claim 17, wherein:

said means further comprises means for substantially preventing occurrence of shear forces between said stamper/imprinter and said substrate/workpiece surface arising from relative movement therebetween during thermal cycling between lower and higher temperatures during said thermal imprint lithography.

* * * * *